US011762031B2

(12) United States Patent
Iyer et al.

(10) Patent No.: US 11,762,031 B2
(45) Date of Patent: Sep. 19, 2023

(54) ELECTROCHEMICAL CELL STATE OF HEALTH DETECTION

(71) Applicant: Medtronic, Inc., Minneapolis, MN (US)

(72) Inventors: Rajesh V. Iyer, Eden Prairie, MN (US); Gordon O. Munns, Stacy, MN (US); John M. Pantazis, Stratford, CT (US); Anthony David Calderoni, Bristol, CT (US); Laura E. McCalla, Brossard (CA); Eric Wigforss, Wallingford, CT (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 17/410,269

(22) Filed: Aug. 24, 2021

(65) Prior Publication Data
US 2022/0065941 A1    Mar. 3, 2022

Related U.S. Application Data

(60) Provisional application No. 63/072,710, filed on Aug. 31, 2020.

(51) Int. Cl.
G01R 31/392    (2019.01)
G01R 31/367    (2019.01)
H02J 7/00      (2006.01)

(52) U.S. Cl.
CPC ......... G01R 31/392 (2019.01); G01R 31/367 (2019.01); H02J 7/0029 (2013.01)

(58) Field of Classification Search
None
See application file for complete search history.

(56) References Cited

U.S. PATENT DOCUMENTS

| 8,952,823 | B2 * | 2/2015 | Xie | G01R 31/382 |
| | | | | 340/636.11 |
| 10,211,487 | B2 | 2/2019 | Kim et al. | |
| 10,522,881 | B1 | 12/2019 | Hom et al. | |
| 2009/0027056 | A1 * | 1/2009 | Huang | G01R 31/392 |
| | | | | 320/132 |
| 2010/0102779 | A1 * | 4/2010 | Ahn | H02J 7/00712 |
| | | | | 320/157 |
| 2011/0245888 | A1 * | 10/2011 | Badelt | A61N 1/3931 |
| | | | | 607/6 |

(Continued)

FOREIGN PATENT DOCUMENTS

KR    20150063254    6/2015

OTHER PUBLICATIONS

International Search Report and Written Opinion from PCT Application No. PCT/US2021/047433 dated Nov. 26, 2021, 8 pages.

Primary Examiner — Jas A Sanghera
(74) Attorney, Agent, or Firm — Mueting Raasch Group

(57) ABSTRACT

An electrochemical cell charging apparatus includes a charger to charge one or more electrochemical cells and a computing apparatus. The computing apparatus includes one or more processors and is operatively coupled to the charger. The computing apparatus is configured to charge an electrochemical cell using the charger, determine one or more indicators of the state of health of the electrochemical cell, and determine the state of health of the electrochemical cell based on the determined one or more indicators.

18 Claims, 6 Drawing Sheets

(56) References Cited

U.S. PATENT DOCUMENTS

| | | | |
|---|---|---|---|
| 2012/0139482 A1* | 6/2012 | Zhang | H02J 7/0071 320/153 |
| 2015/0311736 A1* | 10/2015 | Park | H02J 7/0047 320/103 |
| 2017/0139015 A1 | 5/2017 | Sperling et al. | |
| 2018/0183252 A1* | 6/2018 | Kim | H01M 10/488 |
| 2018/0262027 A1 | 9/2018 | Jung et al. | |
| 2019/0113582 A1* | 4/2019 | Chen | G01R 31/392 |

* cited by examiner

ELECTROCHEMICAL CELL STATE OF HEALTH DETECTION

RELATED APPLICATIONS

This application claims the benefit of U.S. Provisional Patent Application Ser. No. 63/072,710, filed Aug. 31, 2020, which is incorporated by reference herein in its entirety.

FIELD

The present disclosure relates to, among other things, electrochemical cells; and particularly to detection of the state of health of electrochemical cells.

TECHNICAL BACKGROUND

Electrochemical cells can be used in a variety of medical equipment such as ventilators, surgical staplers, medical monitoring equipment, etc. Some electrochemical cells can be recharged to allow repeated use of the electrochemical cells and extend the useful life of such electrochemical cells. However, over time and with repeated use, the electrochemical cells may degrade without showing any outward signs of degradation.

Consequently, some electrochemical cells can fail suddenly and without warning. Failure may include electrochemical cell rupture or electrochemical cell electrolyte venting. Such failure could damage medical equipment and/or leave the medical equipment without a source of power. However, early detection of electrochemical cell degradation or state of health detection may allow electrochemical cells to be replaced before experiencing failure.

BRIEF SUMMARY

Described herein, among other things, is an electrochemical cell charging apparatus configured to determine a state of health of the electrochemical cell. By monitoring the state of health, the apparatus may allow electrochemical cells to be replaced prior to experiencing failure.

As described in more detail below, some electrochemical cells may present an increase in leakage current prior to failure. The electrochemical cell charging apparatus may monitor or determine leakage current or a property associated with leakage current. For example, the charging apparatus may monitor or determine temperature, capacitance loss, frequency of recharge, etc. The apparatus may determine the state of health based on the monitored or determined leakage current or property associated with leakage current.

The electrochemical cell charging apparatus may comprise a charger and a computing apparatus. The computing apparatus controls the charger to charge an electrochemical cell. The computing apparatus may monitor or determine an indicator of a state of health of the electrochemical cell, such as leakage current or a property associated with leakage current. The computing apparatus may determine a state of health of the electrochemical cell based on the monitored or determined indicator. A system including the electrochemical cell charging apparatus may include sensors to sense a temperature of the electrochemical cell, a voltage of the electrochemical cell, a charging current, a state of charge of the electrochemical cell, etc.

In general, in one aspect, the present disclosure describes an electrochemical cell charging apparatus comprising a charger to charge one or more electrochemical cells; and a computing apparatus comprising one or more processors operably coupled to the charger. The computing apparatus is configured to charge an electrochemical cell to a maximum capacity of the electrochemical cell when the electrochemical cell is operatively coupled to the charger. Furthermore, the computing apparatus is configured to determine a leakage current of the charged electrochemical cell and to compare the determined leakage current to a threshold leakage current. The computing apparatus is further configured to determine a state of health of the electrochemical cell based on the comparison.

In embodiments, the system further comprises a current sensor to sense a current of the charger and to provide a sensed current signal. The computing apparatus is further configured to determine a current required to hold the electrochemical cell at a maximum voltage of the electrochemical cell based on the sensed current signal.

In embodiments, the system further comprises one or more sensors to sense a state of charge of the electrochemical cell and to provide a sensed state of charge signal. To determine the leakage current of the electrochemical cell, the computing apparatus is further configured to cease charging of the electrochemical cell and determine the state of charge of the electrochemical cell at an end of a predetermined time period based on the sensed state of charge signal. The predetermined time period beginning when charging of the electrochemical cell is ceased. The computing apparatus is further configured to determine a current required to reach the determined state of charge from the maximum capacity after the time period.

In embodiments, the computing apparatus is configured to charge the electrochemical cell to the maximum capacity of the electrochemical cell a plurality of times and to determine a plurality of leakage currents of the charged electrochemical cell. Each of the determined plurality of leakage currents corresponding to one of the plurality of times the electrochemical cell is charged to the maximum capacity. The determined plurality of leakage currents may comprise a sequence of leakage currents. The computing apparatus may be configured to compare each of the determined plurality of leakage currents to another of the plurality of leakage currents and determine a state of health of the electrochemical cell based on the comparison of each of the determined plurality of leakage currents.

In embodiments, to compare each of the plurality of leakage currents the computing apparatus is configured to determine a plurality of differences. The plurality of differences comprise a difference between each of the determined plurality of leakage currents and a leakage current immediately prior in the sequence of leakage currents. The computing apparatus is configured to compare each determined difference to a threshold difference level. In embodiments, to determine the state of health of the electrochemical cell based on the comparison of the determined plurality of leakage currents, the computing apparatus is configured to determine a number of the determined plurality of differences that exceed the threshold difference level and compare the determined number to a threshold number.

In embodiments, the electrochemical cell is disposed in a device. In embodiments, the device is a medical device. In embodiments, the medical device is a ventilator, surgical stapler, or medical monitoring equipment.

In embodiments, the computing apparatus and associated alert apparatus, such as speaker, vibrator, display, etc., are configured to alert a user to replace the electrochemical cell in the device in response to the determined state of health of the electrochemical cell indicating an end of life of the electrochemical cell.

In embodiments, a system comprises the electrochemical cell charging apparatus, a battery pack, and a battery management system. The battery pack comprises a plurality of electrochemical cells comprising the electrochemical cell. The battery management system is operatively coupled the computing apparatus or is configured to operatively couple to the computing apparatus when the electrochemical cell is operatively coupled to the charger. The battery management system may comprise one or more sensors to sense a voltage, a state of charge, a charging current, or a temperature of the electrochemical cell. The sensors may be positioned and arranged to sense a voltage, a state of charge, a charging current, or a temperature of each electrochemical cell of a battery pack.

In general, in another aspect, the present disclosure describes an electrochemical cell charging apparatus comprising: a charger to charge one or more electrochemical cells; one or more temperature sensors to sense a temperature of each of the one or more electrochemical cells and provide a sensed temperature signal; and a computing apparatus comprising one or more processors operably coupled to the charger and the one or more temperature sensors. The computing apparatus is configured to: cause the charger to charge an electrochemical cell to a constant voltage float charge; determine a temperature difference of the electrochemical cell over a time period during the constant voltage float charge using the sensed temperature signal; and determine a state of health of the electrochemical cell based on the determined temperature difference.

In embodiments, to determine the state of health of the electrochemical cell based on the determined temperature difference the computing apparatus is configured to compare the determined temperature difference to a threshold temperature difference.

In embodiments, the time period is less than one recharge cycle of the electrochemical cell.

In embodiments, the electrochemical cell is disposed in a device. In embodiments, the device is a medical device. In embodiments, the medical device is a ventilator, surgical stapler, or medical monitoring equipment.

In embodiments, the computing apparatus is further configured to alert a user to replace the electrochemical cell in the device in response to the determined state of health of the electrochemical cell indicating an end of life of the electrochemical cell.

In embodiments, a system comprises the electrochemical cell charging apparatus, a battery pack, and a battery management system. The battery pack comprises a plurality of electrochemical cells comprising the electrochemical cell. The battery management system is operatively coupled to the computing apparatus or is configured to operatively couple to the computing apparatus when the electrochemical cell is operatively coupled to the charger. The battery management system may comprise one or more sensors to sense a voltage, a state of charge, a charging current, or a temperature of the electrochemical cell. The sensors may be positioned and arranged to sense a voltage, a state of charge, a charging current, or a temperature of each of the plurality of electrochemical cells of a battery pack.

In general, in another aspect, the present disclosure describes an electrochemical cell charging apparatus comprising a charger to charge one or more electrochemical cells and a computing apparatus comprising one or more processors operably coupled to the charger. The computing apparatus is configured to cause the charger to charge an electrochemical cell, enter a recharge state during the charging of the electrochemical cell, determine a frequency of recharge of the electrochemical cell in the recharge state, and determine a state of health of the electrochemical cell based on the determined frequency.

In embodiments, the system comprises a voltage sensor to sense a voltage of the electrochemical cell. The voltage sensor is operatively coupled to the computing apparatus to provide a voltage signal representative of the sensed voltage to the computing apparatus. In the recharge state the computing apparatus is configured to charge the electrochemical cell to a maximum capacity of the electrochemical cell, cease charging the electrochemical cell, and resume charging the electrochemical cell based on the voltage signal.

In embodiments, the computing apparatus is configured to compare the voltage indicated by the voltage signal to a threshold voltage and resume charging of the electrochemical cell in response to the voltage being lower than the threshold voltage.

In embodiments, the computing apparatus is configured to determine a time period representative of the time from the cessation of charging of the electrochemical cell to the resumption of charging of the electrochemical cell.

In embodiments, the computing apparatus is configured to compare the determined recharge frequency to a threshold frequency.

In embodiments, the computing apparatus is further configured to determine a baseline recharge frequency of the electrochemical cell, compare the baseline recharge frequency to the determined recharge frequency, and determine the state of health of the electrochemical cell based on the comparison.

In embodiments, the electrochemical cell is disposed in a device. In embodiments, the device is a medical device. In embodiments, the medical device is a ventilator, surgical stapler, or medical monitoring equipment.

In embodiments, the computing apparatus and associated alert apparatus are configured to alert a user to replace the electrochemical cell in response to the determined state of health of the electrochemical cell indicating an end of life of the electrochemical cell.

In embodiments, a system comprises the electrochemical charging apparatus, a battery pack, and a battery management system. The battery pack comprises a plurality of electrochemical cells comprising the electrochemical cell. The battery management system is operatively coupled to the computing apparatus or is configured to operatively couple to the computing apparatus when the electrochemical cell is operatively coupled to the charger. The battery management system comprises one or more sensors to sense a voltage, a state of charge, a charging current, or a temperature of the electrochemical cell. The sensors may be positioned and arranged to sense a voltage, a state of charge, a charging current, or a temperature of each of the plurality of electrochemical cells of a battery pack.

In general, in another aspect, the present disclosure describes a method comprising charging an electrochemical cell to a maximum capacity of the electrochemical cell using a charger, determining a leakage current of the charged electrochemical cell, comparing the determined leakage current to a threshold leakage current, and determining a state of health of the electrochemical cell based on the comparison.

In embodiments, determining the leakage current of the electrochemical cell comprises determining a current required to hold the electrochemical cell at a maximum voltage of the electrochemical cell based on the sensed current signal.

In embodiments, determining the leakage current of the electrochemical cell comprises ceasing charging of the electrochemical cell, determining the state of charge of the electrochemical cell at an end of a predetermined time period based on a state of charge of the electrochemical cell, the predetermined time period beginning when the charging of the electrochemical cell ceased, and determining a current required to reach the determined state of charge from the maximum capacity after the time period.

In embodiments, the method comprises charging the electrochemical cell to the maximum capacity of the electrochemical cell a plurality of times and determining a plurality of leakage currents of the charged electrochemical cell. Each of the determined plurality of leakage currents corresponds to one of the plurality of times the electrochemical cell is charged to the maximum capacity. The determined plurality of leakage currents comprise a sequence of leakage currents. The method further comprises comparing each of the determined plurality of leakage currents to another of the plurality of leakage currents and determining a state of health of the electrochemical cell based on the comparison of each of the determined plurality of leakage currents.

In embodiments, comparing each of the plurality of leakage currents comprises determining a plurality of differences. The plurality of differences comprise a difference between each of the determined plurality of leakage currents and a leakage current immediately prior in the sequence of leakage currents. Comparing each of the plurality of leakage currents further comprises comparing each determined difference to a threshold difference level.

In embodiments, determining the state of health of the electrochemical cell based on the comparison of the determined plurality of leakage currents comprises determining a number of the determined plurality of differences that exceed the threshold difference level and comparing the determined number to a threshold number.

In embodiments, the method further comprises alerting a user to replace the electrochemical cell in response to the determined state of health of the electrochemical cell indicating an end of life of the electrochemical cell.

In general, in another aspect, the present disclosure describes a method comprising charging an electrochemical cell to a constant voltage float charge using a charger, determining a temperature difference of the electrochemical cell over a time period during the constant voltage float charge based on a sensed temperature signal provided by a temperature sensor, and determining a state of health of the electrochemical cell based on the determined temperature difference.

In embodiments, the time period is less than one recharge cycle of the electrochemical cell.

In embodiments, the recharge state comprises charging the electrochemical cell to a maximum capacity of the electrochemical cell, ceasing charging the electrochemical cell, and resuming charging the electrochemical cell based on a voltage of the electrochemical cell.

In embodiments, the method further comprises alerting a user to replace the electrochemical cell in response to the determined state of health of the electrochemical cell indicating an end of life of the electrochemical cell.

In general, in another aspect, the present disclosure describes a method comprising charging an electrochemical cell using a charger, entering a recharge state during the charging of the electrochemical cell, determine a frequency of recharge of the electrochemical cell in the recharge state, and determine a state of health of the electrochemical cell based on the determined frequency.

In embodiments, resuming charging the electrochemical cell based on the voltage of the electrochemical cell comprises: comparing the voltage of the electrochemical cell to a threshold voltage; and resuming charging of the electrochemical cell in response to the voltage of the electrochemical cell being lower than the threshold voltage.

In embodiments, determining the frequency of recharge of the electrochemical cell in the recharge state comprises determining a time period representative of the time from the cessation of charging of the electrochemical cell to the resumption of charging of the electrochemical cell.

In embodiments, determining the state of health of the electrochemical cell based on the determined frequency comprises comparing the determined recharge frequency to a threshold frequency.

In embodiments, the method further comprises determining a baseline recharge frequency of the electrochemical cell, comparing the baseline recharge frequency to the determined recharge frequency, and determining the state of health of the electrochemical cell based on the comparison.

In embodiments, the method further comprises alerting a user to replace the electrochemical cell in response to the determined state of health of the electrochemical cell indicating an end of life of the electrochemical cell.

Advantages and additional features of the subject matter of the present disclosure will be set forth in the detailed description which follows, and in part will be readily apparent to those skilled in the art from that description or recognized by practicing the subject matter of the present disclosure as described herein, including the detailed description which follows, the claims, as well as the appended drawings.

It is to be understood that both the foregoing general description and the following detailed description present embodiments of the subject matter of the present disclosure, and are intended to provide an overview or framework for understanding the nature and character of the subject matter of the present disclosure as it is claimed. The accompanying drawings are included to provide a further understanding of the subject matter of the present disclosure and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative and are not intended to limit the scope of the claims in any manner.

BRIEF DESCRIPTION OF THE DRAWINGS

The following detailed description of specific embodiments of the present disclosure can be best understood when read in conjunction with the following drawings, in which.

Figure 1:
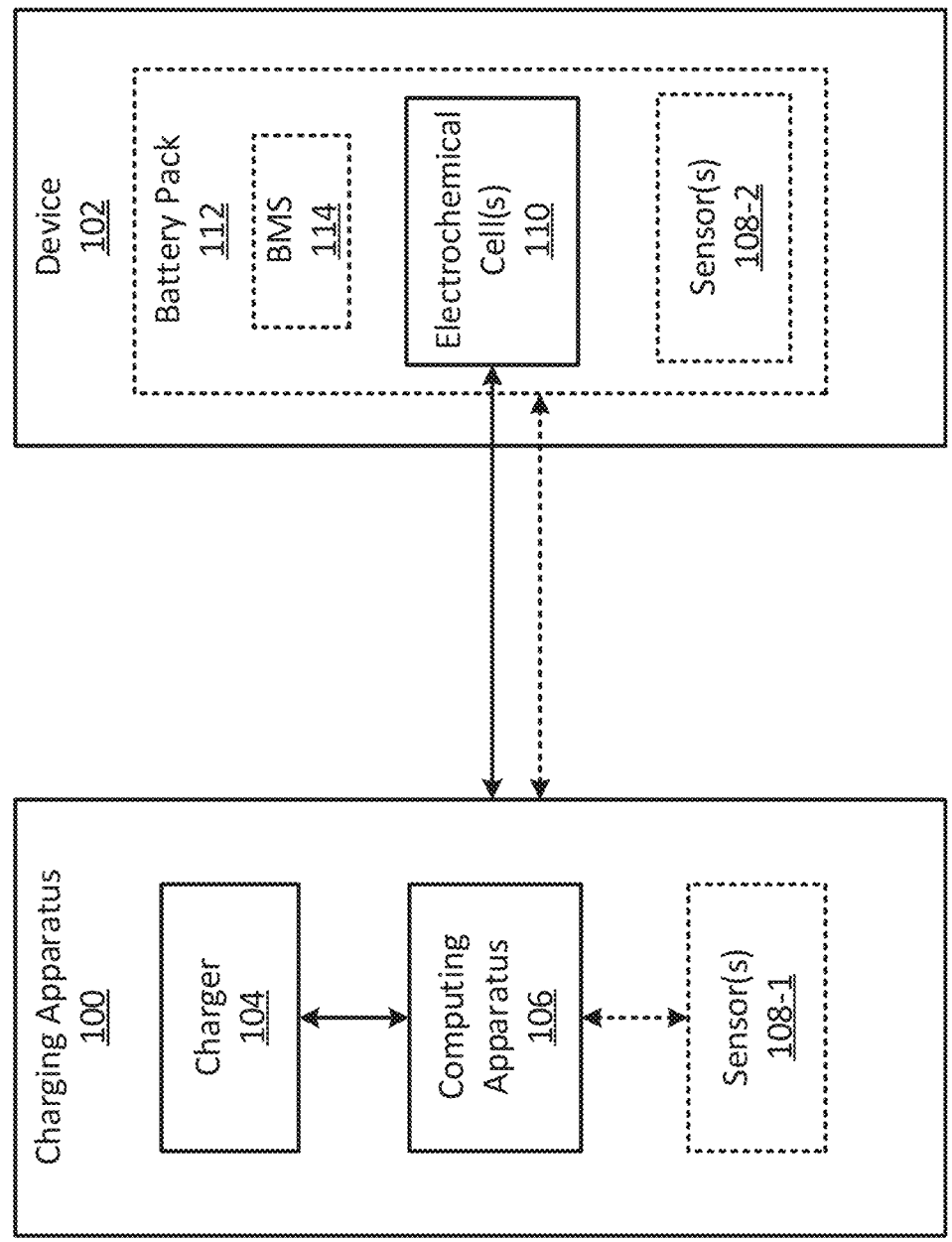
FIG. 1 is a schematic block diagram of an embodiment of an electrochemical cell charging apparatus and a device.

The schematic drawing is not necessarily to scale.

DETAILED DESCRIPTION

Reference will now be made in greater detail to various embodiments of the subject matter of the present disclosure, some embodiments of which are illustrated in the accompanying drawings. Like numbers used in the figures refer to like components and steps. However, it will be understood that the use of a number to refer to a component in a given figure is not intended to limit the component in another figure labeled with the same number. In addition, the use of different numbers to refer to components in different figures is not intended to indicate that the different numbered components cannot be the same or similar to other numbered components.

The present disclosure describes, among other things, an electrochemical cell charging apparatuses configured to, and methods to, determine a state of health of the electrochemical cell. By monitoring the state of health, the apparatus may allow electrochemical cells to be replaced prior to experiencing failure.

It has been determined that some electrochemical cells may present an increase in leakage current prior to failure. The electrochemical cell charging apparatus may monitor or determine leakage current or a property associated with leakage current. For example, the charging apparatus may monitor or determine temperature, capacitance loss, frequency of recharge, etc. and may determine the state of health based on the monitored or determined leakage current or property associated with leakage current.

Some examples of detecting or monitoring of leakage current or a property associated with leakage current include, but are not limited to, detecting leakage current at top of charge; monitoring the frequency of recharge the electrochemical cell while the electrochemical is operatively coupled to the charger; temperature at the top of charge (or period of static float); capacitance fade associated with leakage current; and the like.

Leakage Current or Capacity Fade

A reduction in the ability of an electrochemical cell to remain at a maximum charge may be an early indicator of electrochemical cell damage. Such loss of charge may be caused by internal shorts resulting from separator damage, foreign material conduction, or other factors related to the inability of the electrochemical cell to maintain full charge. Detection of a loss of charge can be performed during charging periods where the electrochemical cell charge level normally would be expected to be static.

A damaged electrochemical cell may not be able to maintain its charge level when a charging current is removed. A voltage of a damaged electrochemical cell may droop during a static charger "float" time period. Such drooping voltage is indicative of a current leak and a loss in electrochemical cell capacity. Additionally or alternatively, a damaged electrochemical cell may experience a rise in charging current when the expected charging current is less than 1 milliamp. Such charging currents can be greater than or equal to 1 milliamp when the expected charging current is less than 1 milliamp.

Alternatively, during charge periods where the electrochemical cell charge level is expected to be static, a loss of charge can be detected using the characteristic voltage of the electrochemical cell (e.g., at zero or very low electrochemical cell currents, i.e. Open Circuit Voltage) and the capacity of the electrochemical cell. The capacity of the electrochemical cell can be determined from a reduction in apparent capacity over a time period. The voltage of the electrochemical cell can be measured over a time period to determine a voltage droop and a droop time. From such parameters, a droop in apparent capacity can be calculated (milliamp hours) and the "apparent electrochemical cell current" can be calculated by dividing by the droop time (hours).

If this "apparent electrochemical cell current" exceeds a threshold, one or more processes can be implemented to prevent failure of the electrochemical cell. For example, the electrochemical cell or a battery pack including the electrochemical cell can be shut down or a user can be alerted to replace the electrochemical cell or battery pack.

Temperature

During charging of an electrochemical cell, a small rise in electrochemical cell temperature may be expected. However, some charging algorithms have periods of static float where no current is expected to flow into the electrochemical cells. Such periods of static float may occur because, at the maximum charge of the electrochemical cell, the charging voltage is expected to be equal to the actual electrochemical cell voltage during the charging constant current/constant voltage algorithm of some electrochemical cells.

If the actual electrochemical cell voltage is equal to the constant voltage of the charger, one would expect that the temperature would not rise during these static periods. However, the temperature can rise in an impaired electrochemical cell as a result of internal energy dissipation that would be commensurate with internal shorts and capacity loss (e.g., a leakage current).

Such an increase in electrochemical cell temperature during the constant voltage state of charge may be a predictor of the state of health of the electrochemical cell. If the temperature rise (e.g., temperature difference) of the electrochemical cell during a constant voltage charge state exceeds a threshold the electrochemical cell may no longer be indicated for use. According, one or more processes can be implemented to prevent failure of the electrochemical cell. For example, the electrochemical cell may be shut down or a user alerted to replace the electrochemical cell or the battery pack.

Recharge State

Some charging algorithms for rechargeable electrochemical cells and battery packs include a "recharge state." in such charging algorithms, the electrochemical cell is charged to a maximum charge (e.g., 100% state of charge (SOC)) and then charging is ceased. While the charging is ceased, the electrochemical cell may power the charging apparatus, causing the battery to discharge over time. Once the battery drops to a threshold SOC, charging of the electrochemical cell may be enabled to charge the battery back to 100% SOC. This cycle may be repeated until the electrochemical cell is removed from the charger.

With a known system load, it can be determined how long a fully charged electrochemical cell or battery should power the system until a recharge to 100% SOC is applied. An electrochemical cell that is experiencing an increase in internal leakage currents may increase the frequency in which the recharge state is entered. This increase in recharge frequency may indicate the state of health of the electrochemical cell. If the recharge frequency exceeds a threshold, the electrochemical cell may no longer be indicated for use. According, one or more processes can be implemented to prevent failure of the electrochemical cell. For example, the electrochemical cell may be shut down or a user alerted to replace the electrochemical cell or the battery pack.

The apparatus, systems, and methods described herein may enhance the performance and reliability of electrochemical cells or battery packs. Shutting down or replacing the electrochemical cell or the battery pack early enough may prevent build-up of internal electrochemical cell pressure that may otherwise reach levels that would cause electrochemical cell to rupture or cause electrochemical cell electrolyte venting.

As used herein, "threshold" means, (i) an absolute value of whatever is being measured, which may or may not include a time component, and if it includes a time component, the value of the threshold may change, (ii) a number of repeated measurements in the same direction (e.g., leakage current increases in three consecutive measurements) regardless of value, and (iii) combinations of (i) and (ii).

Referring now to FIG. 1, a schematic block diagram of a charging apparatus 100 and a device 102 is shown.

The charging apparatus 100 includes a charger 104 and a computing apparatus 106. The charging apparatus 100 may optionally include one or more sensors 108-1. The charger 100 may include a housing (not shown) to house the charger 104 and the computing apparatus 106. The housing may also house the sensors 108-1.

The device 102 includes one or more electrochemical cells 110. The electrochemical cells 110 can optionally be included in a battery pack 112. The battery pack 112 may include a battery management system (BMS) 114 and one or more sensors 108-2. The device 102 may be a medical device. The medical device may be a ventilator, surgical stapler, or medical monitoring equipment.

The charger 104 may be configured to charge the electrochemical cells 110 or battery pack 112. The charger 104 may include any suitable circuitry or electronics to charge the electrochemical cells 110 or battery pack 112 such as, e.g., a power source, rectifier circuit, power circuit, control circuit, regulator circuit, fault detection circuit, etc.

The computing apparatus 104 may be operatively coupled to the charger 104.

The computing apparatus 104 may control the charger to charge the electrochemical cells 110. The computing apparatus 104 may be operatively coupled to the sensors 108-1. The computing apparatus may be configured to to monitor various conditions related to charging the electrochemical cells 110 such as, e.g., charging current, voltage, temperature, etc. Additionally, the computing apparatus 106 may be configured to determine a state of health of the electrochemical cells 110 according to the various methods described herein. For example, the computing apparatus 106 may be configured to determine the state of health of the electrochemical cells 110 based on a leakage current, electrochemical cell temperature, temperature difference, recharge frequency, capacitance fade, etc. Furthermore, the computing apparatus 106 may be configured to determine leakage current, electrochemical cell temperature, temperature difference, recharge frequency, or capacitance fade based on the monitored conditions related to charging the electrochemical cells 110.

The electrochemical cells 110 may include any suitable type or chemistry such as, e.g., nickel metal hydride, lithium ion, lead acid, Lithium Cobalt Oxide, etc. The electrochemical cells 110 are rechargeable electrochemical cells. The electrochemical cells 110 may have any suitable voltage, capacity, supply current, etc. The electrochemical cells 110 may be incorporated into a battery pack 112.

The battery pack 112 may include a plurality of electrochemical cells 110. The electrochemical cells 110 can be arranged in parallel, series, or a combination thereof. The battery pack 112 may include the BMS 114 to monitor the electrochemical cells 110, maintain safe operating conditions of the electrochemical cells, reporting various conditions of the electrochemical cells, etc. The battery pack 112 may further include sensors 108-2 to sense temperature, voltage, current, etc.

The sensors 108-1, 108-2 (referred to collectively as sensors 108) may include any suitable sensor or sensors such as, e.g., temperature sensors, current sensors, voltage sensors, state of charge sensors, etc. The sensors 108 may provide a sensed temperature signal, sensed current signal, sensed voltage signal, sensed state of charge signal, etc. The signals provided by the sensors 108 may be indicative of the properties sensed by the sensors.

Figure 2:
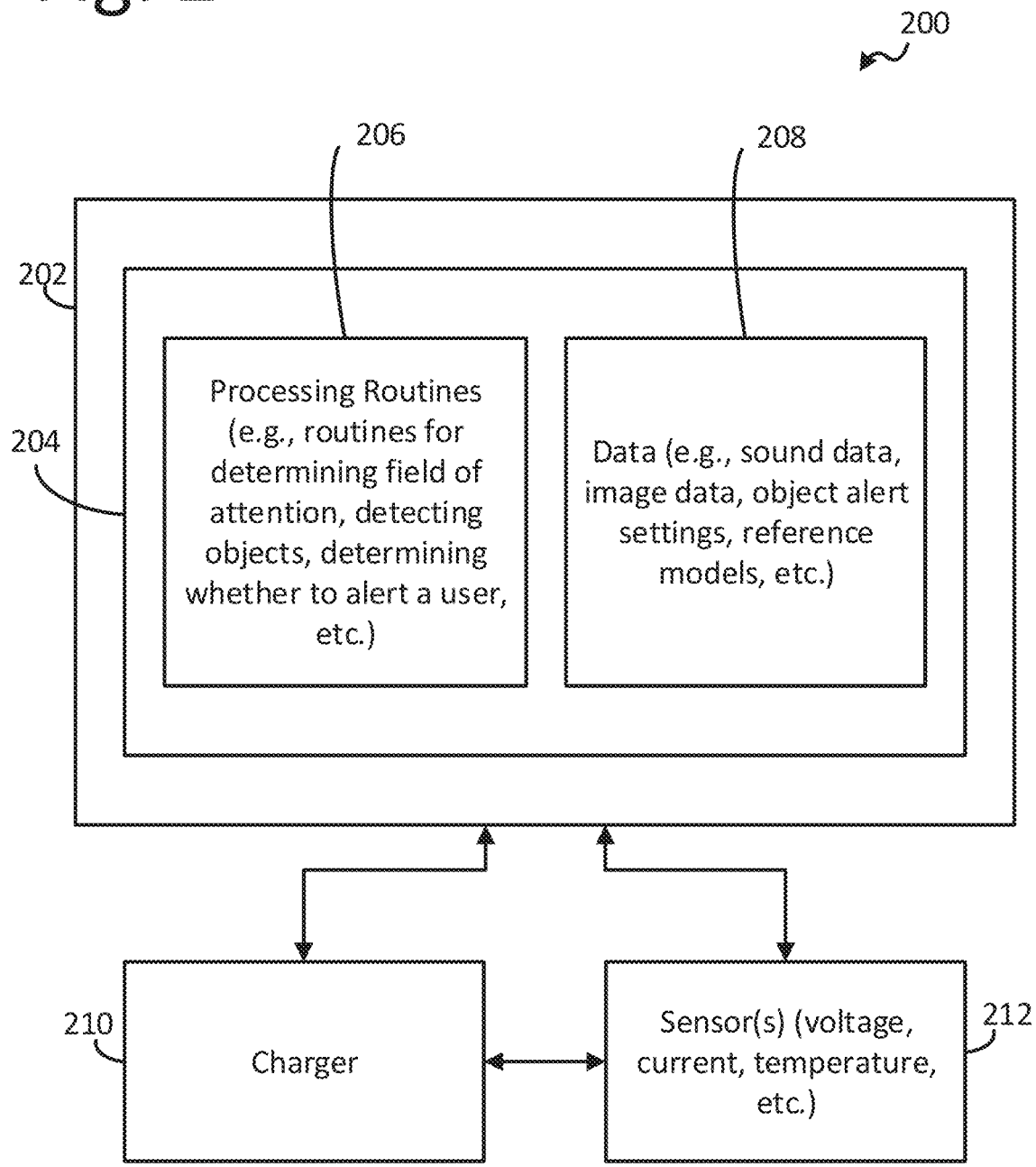
FIG. 2 is a schematic block diagram of an embodiment of an electrochemical cell charging apparatus.

Referring now to FIG. 2, a schematic block diagram of a charging apparatus 200 according to embodiments described herein is shown. The charging apparatus 200 may include a computing apparatus or processor 202 and a charger 210. Generally, the charger 210 may be operably coupled to the computing apparatus 202 and may include any suitable circuits or devices configured charge electrochemical cells. For example, the charger 210 may include one or more power sources, rectifier circuits, power circuits, control circuits, regulator circuits, fault detection circuits, etc.

The charging apparatus 200 may additionally include one or more sensors 212 operably coupled to the computing apparatus 202. Generally, the sensors 212 may include any one or more devices configured to sense charging information of the charger 210 or electrochemical cells. The sensors 212 may include any apparatus, structure, or device to capture the charging information of the charger such as one or more current sensors, voltage sensors, temperature sensors, etc.

Further, the computing apparatus 202 includes data storage 204. Data storage 204 allows for access to processing programs or routines 206 and one or more other types of data 208 that may be employed to carry out the techniques, processes, and algorithms of determining a health of an electrochemical cell. For example, processing programs or routines 206 may include programs or routines for determining a leakage current, determining a temperature difference, determining a frequency of recharge, determining a state of health of an electrochemical cell, computational mathematics, matrix mathematics, Fourier transforms, compression algorithms, calibration algorithms, image construction algorithms, inversion algorithms, signal processing algorithms, normalizing algorithms, deconvolution algorithms, averaging algorithms, standardization algorithms, comparison algorithms, vector mathematics, analyzing sound data, analyzing hearing device settings, detecting defects, or any other processing required to implement one or more embodiments as described herein.

Data 208 may include, for example, temperature data, voltage data, charging current data, state of health data, state of charge data, thresholds, arrays, meshes, grids, variables, counters, statistical estimations of accuracy of results, results from one or more processing programs or routines employed according to the disclosure herein (e.g., determining a state of health of an electrochemical cell, etc.), or any other data that may be necessary for carrying out the one or more processes or techniques described herein.

In one or more embodiments, the charging apparatus 200 may be controlled using one or more computer programs executed on programmable computers, such as computers that include, for example, processing capabilities (e.g., microcontrollers, programmable logic devices, etc.), data storage (e.g., volatile or non-volatile memory and/or storage elements), input devices, and output devices. Program code and/or logic described herein may be applied to input data to perform functionality described herein and generate desired output information. The output information may be applied as input to one or more other devices and/or processes as described herein or as would be applied in a known fashion.

The programs used to implement the processes described herein may be provided using any programmable language, e.g., a high-level procedural and/or object orientated programming language that is suitable for communicating with a computer system. Any such programs may, for example, be stored on any suitable device, e.g., a storage media, readable by a general or special purpose program, computer or a processor apparatus for configuring and operating the computer when the suitable device is read for performing the procedures described herein. In other words, at least in one embodiment, the charging apparatus 200 may be controlled using a computer readable storage medium, configured with a computer program, where the storage medium so configured causes the computer to operate in a specific and predefined manner to perform functions described herein.

The computing apparatus 202 may be, for example, any fixed or mobile computer system (e.g., a personal computer or minicomputer). The exact configuration of the computing apparatus is not limiting and essentially any device capable of providing suitable computing capabilities and control capabilities (e.g., control the sound output of the charging apparatus 200, the acquisition of data, such as image data, audio data, or sensor data) may be used. Additionally, the computing apparatus 202 may be incorporated in a housing of the charging apparatus 200. Further, various peripheral devices, such as a computer display, mouse, keyboard, memory, printer, scanner, etc. are contemplated to be used in combination with the computing apparatus 202. Further, in one or more embodiments, the data 208 (e.g., image data, sound data, voice data, audio data, audio classes, audio objects, optical components, hearing impairment settings, hearing device settings, an array, a mesh, a digital file, etc.) may be analyzed by a user, used by another machine that provides output based thereon, etc. As described herein, a digital file may be any medium (e.g., volatile or non-volatile memory, a CD-ROM, a punch card, magnetic recordable tape, etc.) containing digital bits (e.g., encoded in binary, trinary, etc.) that may be readable and/or writeable by computing apparatus 202 described herein. Also, as described herein, a file in user-readable format may be any representation of data (e.g., ASCII text, binary numbers, hexadecimal numbers, decimal numbers, audio, graphical) presentable on any medium (e.g., paper, a display, sound waves, etc.) readable and/or understandable by a user.

In view of the above, it will be readily apparent that the functionality as described in one or more embodiments according to the present disclosure may be implemented in any manner as would be known to one skilled in the art. As such, the computer language, the computer system, or any other software/hardware that is to be used to implement the processes described herein shall not be limiting on the scope of the systems, processes or programs (e.g., the functionality provided by such systems, processes or programs) described herein.

The techniques described in this disclosure, including those attributed to the systems, or various constituent components, may be implemented, at least in part, in hardware, software, firmware, or any combination thereof. For example, various aspects of the techniques may be implemented by the computing apparatus 202, which may use one or more processors such as, e.g., one or more microprocessors, DSPs, ASICs, FPGAs, CPLDs, microcontrollers, or any other equivalent integrated or discrete logic circuitry, as well as any combinations of such components, image processing devices, or other devices. The term "processing apparatus," "processor," or "processing circuitry" may generally refer to any of the foregoing logic circuitry, alone or in combination with other logic circuitry, or any other equivalent circuitry. Additionally, the use of the word "processor" may not be limited to the use of a single processor but is intended to connote that at least one processor may be used to perform the techniques and processes described herein.

Such hardware, software, and/or firmware may be implemented within the same device or within separate devices to support the various operations and functions described in this disclosure. In addition, any of the described components may be implemented together or separately as discrete but interoperable logic devices. Depiction of different features, e.g., using block diagrams, etc., is intended to highlight different functional aspects and does not necessarily imply that such features must be realized by separate hardware or software components. Rather, functionality may be performed by separate hardware or software components or integrated within common or separate hardware or software components.

When implemented in software, the functionality ascribed to the systems, devices and techniques described in this disclosure may be embodied as instructions on a computer-readable medium such as RAM, ROM, NVRAM, EEPROM, FLASH memory, magnetic data storage media, optical data storage media, or the like. The instructions may be executed by the computing apparatus 202 to support one or more aspects of the functionality described in this disclosure.

Figure 3:
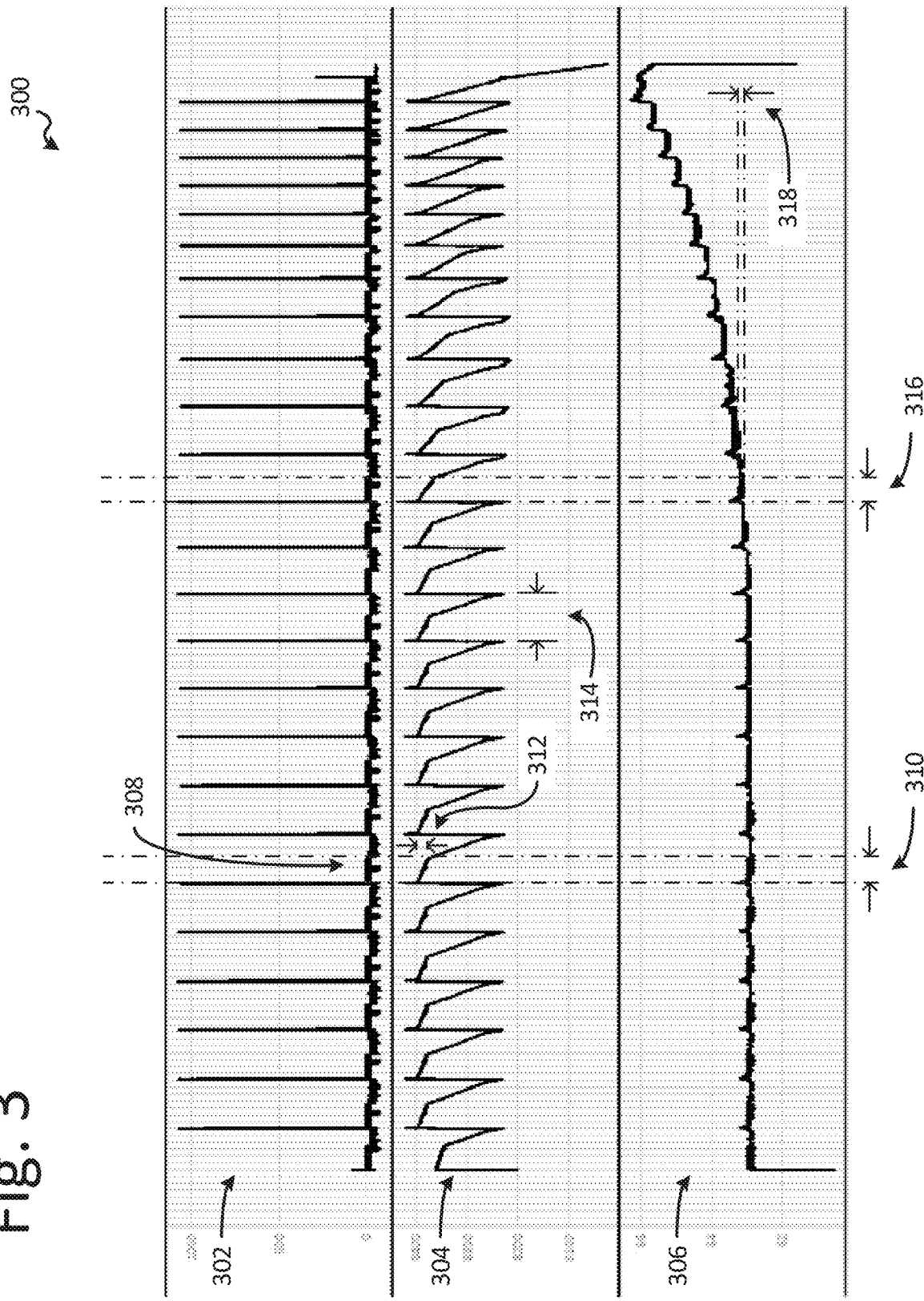
FIG. 3 is a graph illustrating a maximum current, a maximum voltage, and a maximum temperature of an electrochemical cell over multiple recharge cycles.

Referring now to FIG. 3, a graph 300 illustrating a current 302, a voltage 304, and a temperature 306 of an electrochemical cell over multiple recharge cycles is shown. The graph 300 depicts a droop time 310 of a recharge cycle and the corresponding droop current 308 and droop voltage 312. The graph depicts a recharge cycle time 314. The graph 300 depicts another droop time 316 and a corresponding temperature increase 318.

Figure 4:
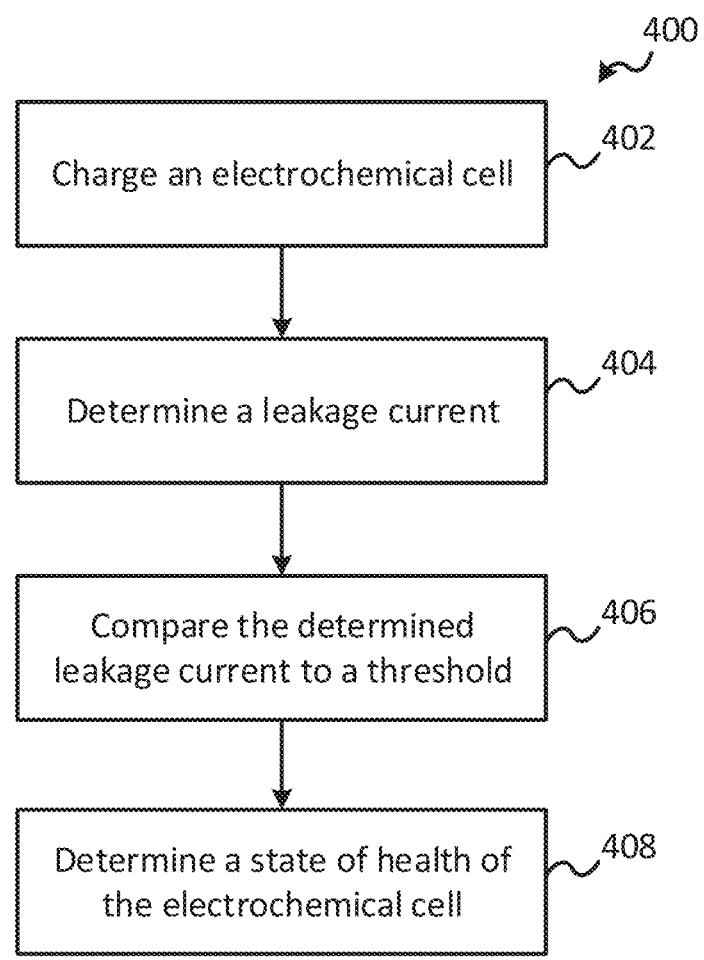
FIG. 4 is a flow diagram of an embodiment of a process for determining a state of health of an electrochemical cell.

Referring now to FIG. 4, a flow diagram of an embodiment of a process 400 for determining a state of health of an electrochemical cell is shown.

At 402, an electrochemical cell is charged to a maximum capacity of the electrochemical cell using a charger (e.g., charger 104 of FIG. 1 or charger 210 of FIG. 2). At 404, a leakage current of the charged electrochemical cell is determined. The leakage current may be determined using any suitable method or methods. In one embodiment, determining the leakage current of the electrochemical cell includes determining a current required to hold the electrochemical cell at a maximum voltage of the electrochemical cell based on the sensed current signal. In another embodiment, determining the leakage current of the charged electrochemical cell includes ceasing charging of the electrochemical cell, determining the state of charge of the electrochemical cell at an end of a predetermined time period based on a state of charge of the electrochemical cell, and determining a current required to reach the determined state of charge from the maximum capacity after the time period. The predetermined time period may begin when the charging of the electrochemical cell ceased.

At 406, the determined leakage current is compared to a threshold leakage current. At 408, a state of health of the electrochemical cell is determined based on the comparison of the leakage current to the threshold leakage current.

In embodiments, the process 400 may further include charging the electrochemical cell to the maximum capacity of the electrochemical cell a plurality of times. A plurality of leakage currents of the charged electrochemical cell may be determined. Each of the determined plurality of leakage currents may correspond to one of the plurality of times the electrochemical cell is charged to the maximum capacity. The determined plurality of leakage currents may include a sequence of leakage currents. Each of the determined plurality of leakage currents may be compared to another of the plurality of leakage currents.

Comparing each of the determined plurality of leakage currents may include determining a plurality of differences. The plurality of differences may include a difference between each of the determined plurality of leakage currents and a leakage current immediately prior in the sequence of leakage currents. In embodiments, each difference may be compared to a threshold difference level. A state of health of the electrochemical cell may be based on the comparison of each determined difference to the threshold difference level. In embodiments, each of the determined difference levels may be compared to a difference level immediately prior to the determined difference level. A number of difference level increases may be determined. The number of differences may be compared to a threshold number of differences. The state of health of the electrochemical cell may be determined based on the comparison of the number of sequential differences to the threshold number of differences.

In embodiments, the determined number of differences is the maximum number of sequential differences. In embodiments, the determined number of differences is a maximum number of differences within a predetermined number of recharge cycles.

In embodiments, the process 400 further includes alerting a user to replace the electrochemical cell in response to the determined state of health of the electrochemical cell indicating an end of life of the electrochemical cell.

Figure 5:
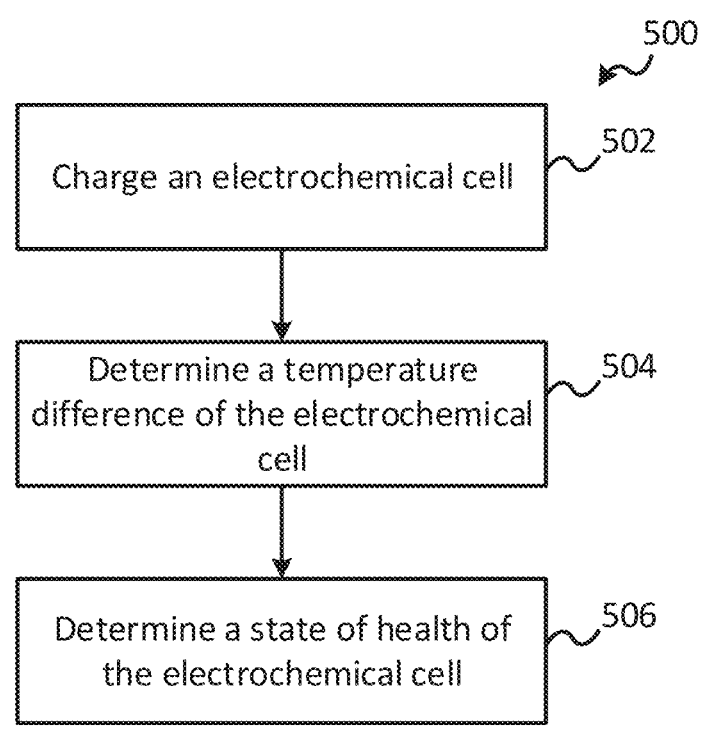
FIG. 5 is a flow diagram of another embodiment of a process for determining a state of health of an electrochemical cell.

Referring now to FIG. 5, a flow diagram of another embodiment of a process 500 for determining a state of health of an electrochemical cell is shown.

At 502, an electrochemical cell is charged to a constant voltage float charge using a charger. At 504, a temperature difference of the electrochemical cell over a time period during the constant voltage float charge is determined. The temperature difference may be determined based on a sensed temperature signal provided by a temperature sensor. The time period may be less than one recharge cycle of the electrochemical cell.

Figure 6:
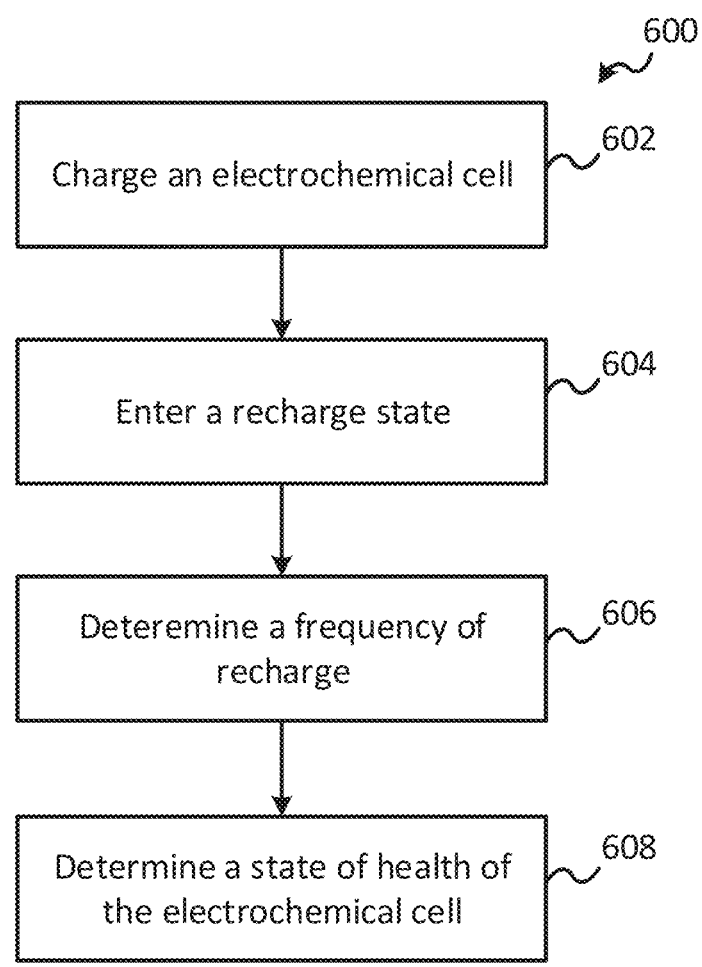
FIG. 6 is a flow diagram of another embodiment of a process for determining a state of health of an electrochemical cell.

At 506, a state of health of the electrochemical cell may be determined based on the determined temperature difference. Determining the state of health of the electrochemical cell based on the determined temperature difference may include comparing the determined temperature difference to a threshold temperature difference Referring now to FIG. 6, a flow diagram of another embodiment of a process 600 for determining a state of health of an electrochemical cell is shown.

At 602, an electrochemical cell is charged using a charger. At, 604 a recharge state is entered during the charging of the electrochemical cell. The recharge state may include charging the electrochemical cell to a maximum capacity of the electrochemical cell, ceasing charging the electrochemical cell, and resuming charging the electrochemical cell based on a voltage of the electrochemical cell. Resuming the charging of the electrochemical cell may include comparing the voltage of the electrochemical cell to a threshold voltage, and resuming charging of the electrochemical cell in response to the voltage of the electrochemical cell being lower than the threshold voltage At 606, a frequency of recharge of the electrochemical cell in the recharge state is determined. Determining the frequency of recharge of the electrochemical cell in the recharge state may include determining a time period representative of the time from the cessation of charging of the electrochemical cell to the resumption of charging of the electrochemical cell. At 608, a state of health of the electrochemical cell is determined based on the determined frequency. Determining the state of health of the electrochemical cell based on the determined frequency may include comparing the determined recharge frequency to a threshold frequency. The process 600 may further include alerting a user to replace the electrochemical cell in response to the determined state of health of the electrochemical cell indicating an end of life of the electrochemical cell.

The process 600 may still further include determining a baseline recharge frequency of the electrochemical cell. The baseline recharge frequency may be compared to the determined recharge frequency. The state of health of the electrochemical cell may be determined based on the comparison of the baseline recharge frequency to the determined recharge frequency.

All scientific and technical terms used herein have meanings commonly used in the art unless otherwise specified. The definitions provided herein are to facilitate understanding of certain terms used frequently herein and are not meant to limit the scope of the present disclosure.

As used herein, singular forms "a," "an" and "the" include plural referents unless the context clearly dictates otherwise. As used in this specification and the appended claims, the term "or" is generally employed in its sense including "and/or" unless the content clearly dictates otherwise. The term "and/or" means one or all of the listed elements or a combination of any two or more of the listed elements.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the inventive technology.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be apparent to those skilled in the art that various modifications and variations can be made to the present inventive technology without departing from the spirit and scope of the disclosure. Since modifications, combinations, sub-combinations and variations of the disclosed embodiments incorporating the spirit and substance of the inventive technology may occur to persons skilled in the art, the inventive technology should be construed to include everything within the scope of the appended claims and their equivalents.

What is claimed is:

1. An electrochemical cell charging apparatus comprising:
a charger to charge one or more electrochemical cells; and
a computing apparatus comprising one or more processors operably coupled to the charger and configured to:
cause the charger to charge an electrochemical cell to a maximum capacity of the electrochemical cell;
determine a leakage current of the charged electrochemical cell;
compare the determined leakage current to a threshold leakage current; and
determine a state of health of the electrochemical cell based on the comparison,
wherein
(a) the apparatus further comprises a current sensor to sense a current of the charger and provide a sensed current signal, wherein to determine the leakage current of the electrochemical cell, the computing apparatus is further configured to determine a current required to hold the electrochemical cell at a maximum voltage of the electrochemical cell based on the sensed current signal;
(b) the apparatus further comprises one or more sensors to sense a state of charge of the electrochemical cell and provide a sensed state of charge signal, wherein to determine the leakage current of the electrochemical cell, the computing apparatus is further configured to (i) cease charging of the electrochemical cell, (ii) determine the state of charge of the electrochemical cell at an end of a predetermined time period based on the sensed state of charge signal, the predetermined time period beginning when the charging of the electrochemical cell ceased, (iii) and determine a current required to reach the determined state of charge from the maximum capacity after the time period; or
(c) the computing apparatus is further configured to (i) charge the electrochemical cell to the maximum capacity of the electrochemical cell a plurality of times, (ii) determine a plurality of leakage currents of the charged electrochemical cell, each of the determined plurality of leakage currents corresponding to one of the plurality of times the electrochemical cell is charged to the maximum capacity, the determined plurality of leakage currents comprising a sequence of leakage currents, (iii) compare each of the determined plurality of leakage currents to another of the plurality of leakage currents, and (iv) determine a state of health of the electrochemical cell based on the comparison of each of the determined plurality of leakage currents.

2. The apparatus of claim 1, further comprising the current sensor to sense the current of the charger and provide the sensed current signal, wherein to determine the leakage current of the electrochemical cell, the computing apparatus is further configured to determine the current required to hold the electrochemical cell at the maximum voltage of the electrochemical cell based on the sensed current signal.

3. The apparatus of claim 1, further comprising the one or more sensors to sense the state of charge of the electrochemical cell and provide the sensed state of charge signal, wherein to determine the leakage current of the electrochemical cell, the computing apparatus is further configured to:
cease charging of the electrochemical cell;
determine the state of charge of the electrochemical cell at the end of the predetermined time period based on the sensed state of charge signal, the predetermined time period beginning when the charging of the electrochemical cell ceased; and
determine the current required to reach the determined state of charge from the maximum capacity after the time period.

4. The apparatus of claim 1, wherein the computing apparatus is further configured to:
charge the electrochemical cell to the maximum capacity of the electrochemical cell the plurality of times;
determine the plurality of leakage currents of the charged electrochemical cell, each of the determined plurality of leakage currents corresponding to one of the plurality of times the electrochemical cell is charged to the maximum capacity, the determined plurality of leakage currents comprising the sequence of leakage currents;
compare each of the determined plurality of leakage currents to another of the plurality of leakage currents; and
determine a state of health of the electrochemical cell based on the comparison of each of the determined plurality of leakage currents.

5. The apparatus of claim 4, wherein to compare each of the plurality of leakage currents the computing apparatus is further configured to:
determine a plurality of differences, the plurality of differences comprising a difference between each of the determined plurality of leakage currents and a leakage current immediately prior in the sequence of leakage currents; and
compare each determined difference to a threshold difference level.

6. The apparatus of claim 5, wherein to determine the state of health of the electrochemical cell based on the comparison of the determined plurality of leakage currents, the computing apparatus is configured to:
determine a number of the determined plurality of differences that exceed the threshold difference level; and
compare the determined number to a threshold number.

7. The apparatus of claim 1, wherein the electrochemical cell is disposed in a device.

8. The apparatus of claim 7, wherein the device is a medical device.

9. The apparatus of claim 8, wherein the medical device is a ventilator, surgical stapler, or medical monitoring equipment.

10. The apparatus of claim 1, wherein the computing apparatus is further configured to alert a user to replace the electrochemical cell in response to the determined state of health of the electrochemical cell indicating an end of life of the electrochemical cell.

11. The apparatus of claim 1, further comprising a battery pack, wherein the battery pack comprises:
a plurality of electrochemical cells the plurality of electrochemical cells comprising the electrochemical cell; and
a battery management apparatus operatively coupled to the computing apparatus and comprising one or more sensors to sense a voltage, a state of charge, a charging current, or a temperature of each of the plurality of electrochemical cells.

12. A method comprising:
charging an electrochemical cell to a maximum capacity of the electrochemical cell using a charger;
determining a leakage current of the charged electrochemical cell;
comparing the determined leakage current to a threshold leakage current; and
determining a state of health of the electrochemical cell based on the comparison,
wherein
(a) determining the leakage current of the electrochemical cell comprises determining a current required to hold the electrochemical cell at a maximum voltage of the electrochemical cell based on a sensed current signal,
(b) determining the leakage current of the electrochemical cell comprises determining a current required to hold the electrochemical cell at a maximum voltage of the electrochemical cell based on a sensed current signal, or
(c) determining the leakage current of the electrochemical cell comprises (i) ceasing charging of the electrochemical cell, (ii) determining the state of charge of the electrochemical cell at an end of a predetermined time period based on a state of charge of the electrochemical cell, the predetermined time period beginning when the charging of the electrochemical cell ceased, and (iii) determining a current required to reach the determined state of charge from the maximum capacity after the time period; or
wherein the method further comprises (i) charging the electrochemical cell to the maximum capacity of the electrochemical cell a plurality of times, (ii) determining a plurality of leakage currents of the charged electrochemical cell, each of the determined plurality of leakage currents corresponding to one of the plurality of times the electrochemical cell is charged to the maximum capacity, the determined plurality of leakage currents comprising a sequence of leakage currents, (iii) comparing each of the determined plurality of leakage currents to another of the plurality of leakage currents; and (iv) determining a state of health of the electrochemical cell based on the comparison of each of the determined plurality of leakage currents.

13. The method of claim 12, wherein determining the leakage current of the electrochemical cell comprises determining the current required to hold the electrochemical cell at the maximum voltage of the electrochemical cell based on the sensed current signal.

14. The method of claim 12, wherein determining the leakage current of the electrochemical cell comprises:
ceasing charging of the electrochemical cell;
determining the state of charge of the electrochemical cell at an end of the predetermined time period based on the state of charge of the electrochemical cell, the predetermined time period beginning when the charging of the electrochemical cell ceased; and
determining a current required to reach the determined state of charge from the maximum capacity after the time period.

15. The method of claim 12, further comprising:
charging the electrochemical cell to the maximum capacity of the electrochemical cell the plurality of times;
determining a plurality of leakage currents of the charged electrochemical cell, each of the determined plurality of leakage currents corresponding to one of the plurality of times the electrochemical cell is charged to the maximum capacity, the determined plurality of leakage currents comprising a sequence of leakage currents;
comparing each of the determined plurality of leakage currents to another of the plurality of leakage currents; and
determining the state of health of the electrochemical cell based on the comparison of each of the determined plurality of leakage currents.

16. The method of claim 15, wherein comparing each of the plurality of leakage currents comprises:
determining a plurality of differences, the plurality of differences comprising a difference between each of the determined plurality of leakage currents and a leakage current immediately prior in the sequence of leakage currents; and
comparing each determined difference to a threshold difference level.

17. The method of claim 16, wherein determining the state of health of the electrochemical cell based on the comparison of the determined plurality of leakage currents comprises:
determining a number of the determined plurality of differences that exceed the threshold difference level; and
comparing the determined number to a threshold number.

18. The method of claim 12, further comprising alerting a user to replace the electrochemical cell in response to the determined state of health of the electrochemical cell indicating an end of life of the electrochemical cell.

* * * * *